United States Patent [19]
Matthews et al.

[11] Patent Number: 5,124,580
[45] Date of Patent: Jun. 23, 1992

[54] BICMOS LOGIC GATE HAVING LINEARLY OPERATED LOAD FETS

[75] Inventors: James A. Matthews, Milpitas; Geert Rosseel, Fremont, both of Calif.

[73] Assignee: MicroUnity Systems Engineering, Inc., Sunnyvale, Calif.

[21] Appl. No.: 693,815

[22] Filed: Apr. 30, 1991

[51] Int. Cl.[5] ............................. H03K 17/16
[52] U.S. Cl. ............................. 307/446; 307/443; 307/455; 307/296.6
[58] Field of Search ............... 307/443, 446, 455, 520, 307/296.6

[56] References Cited

U.S. PATENT DOCUMENTS

| 4,425,516 | 1/1984 | Wanlass | 307/446 |
|---|---|---|---|
| 4,678,943 | 7/1987 | Uragami et al. | 307/446 |
| 4,701,642 | 10/1987 | Pricer | 307/446 |
| 4,713,560 | 12/1987 | Herndon | 307/455 |
| 4,845,385 | 7/1989 | Ruth, Jr. | 307/446 |
| 4,853,560 | 8/1989 | Iwamura et al. | 307/446 |
| 4,868,421 | 9/1989 | Herndon et al. | 307/446 |
| 4,871,928 | 10/1989 | Bushey | 307/446 |
| 4,902,915 | 2/1990 | Tran | 307/296.6 X |
| 4,999,519 | 3/1991 | Kitsukawa et al. | 307/446 |

Primary Examiner—David Hudspeth
Attorney, Agent, or Firm—Blakely, Sokoloff, Taylor & Zafman

[57] ABSTRACT

A BiCMOS logic circuit utilizes an emitter-coupled pair of bipolar transistors for differentially comparing an input signal with a logic reference level. Each of the bipolar transistors are resistively loaded by a p-channel metal-oxide-semiconductor (PMOS) transistor. An emitter follower, having its base coupled to the collector of one of the bipolar transistors and its collector connected to the first power supply potential, provides the output signal. NMOS transistors are used as current sources for biasing the emitter-coupled pair and the emitter follower. A circuit means provides a feedback signal coupled to the gates of the PMOS transistors for dynamically controlling the load resistance presented to said emitter coupled pair.

33 Claims, 3 Drawing Sheets

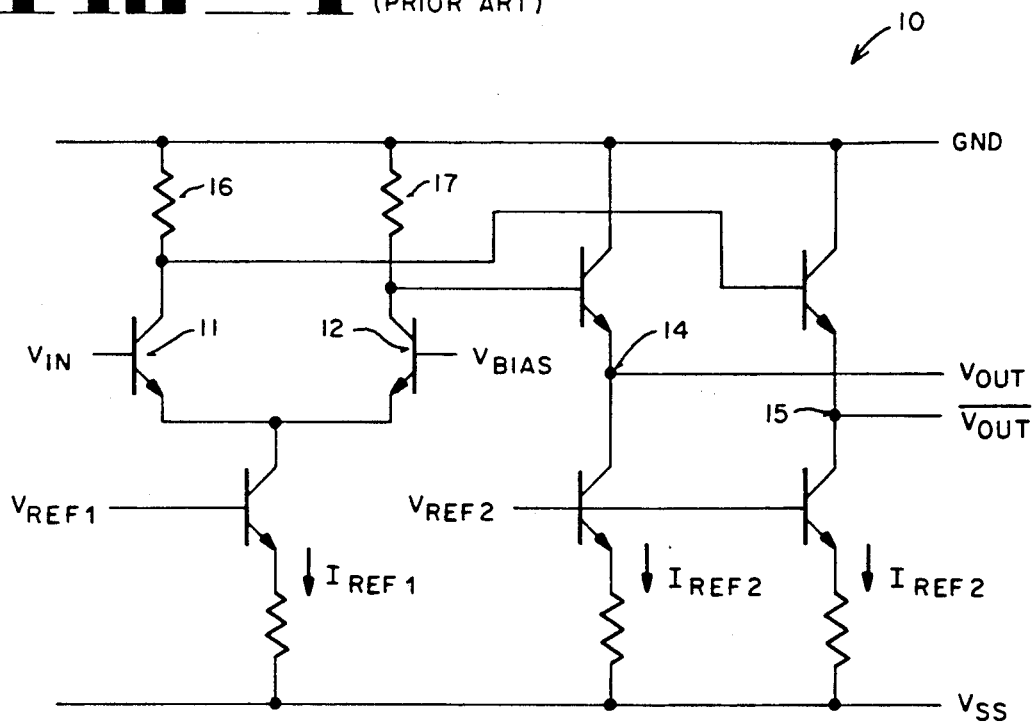
FIG_1 (PRIOR ART)
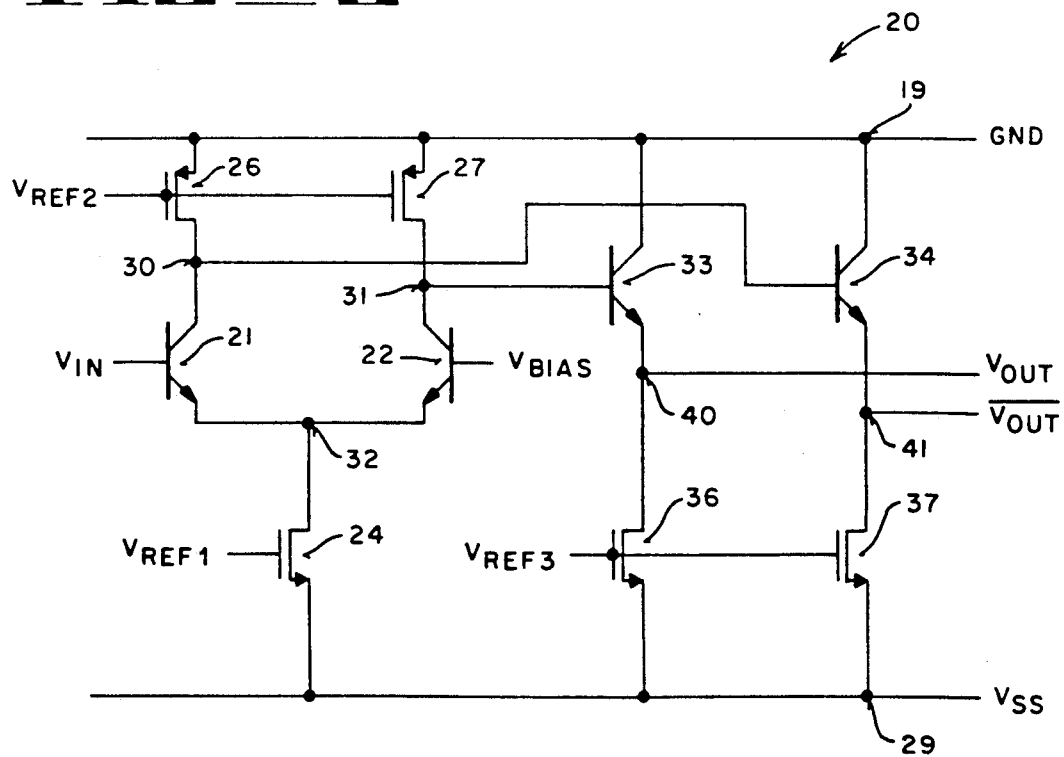
FIG_2

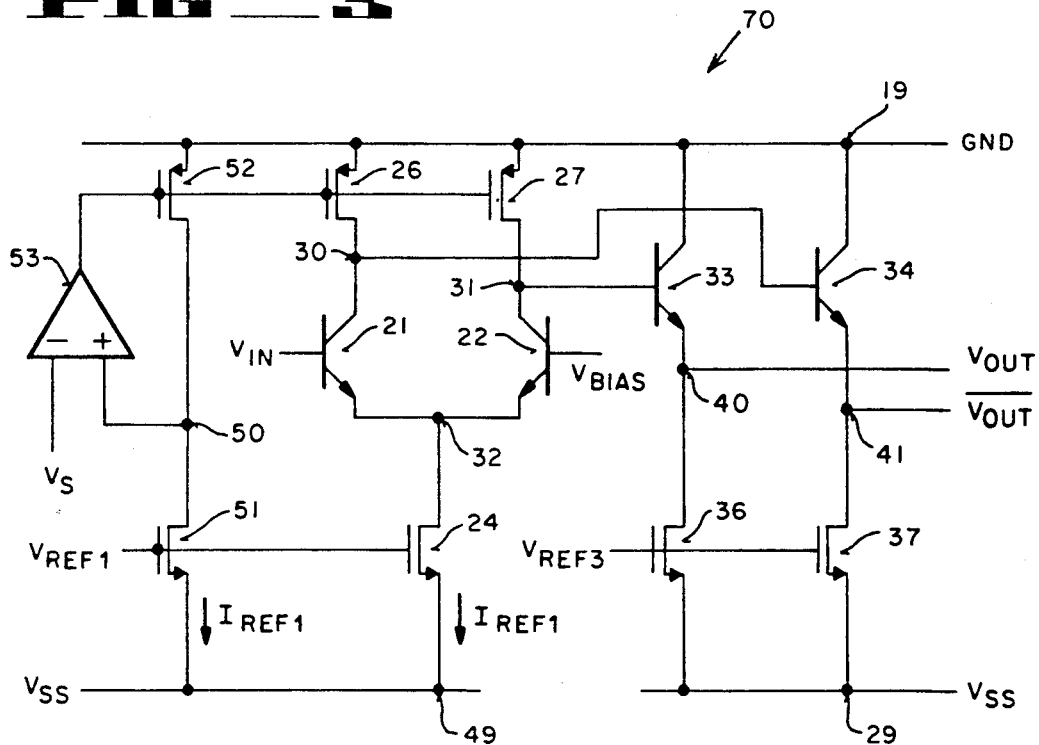
FIG_3
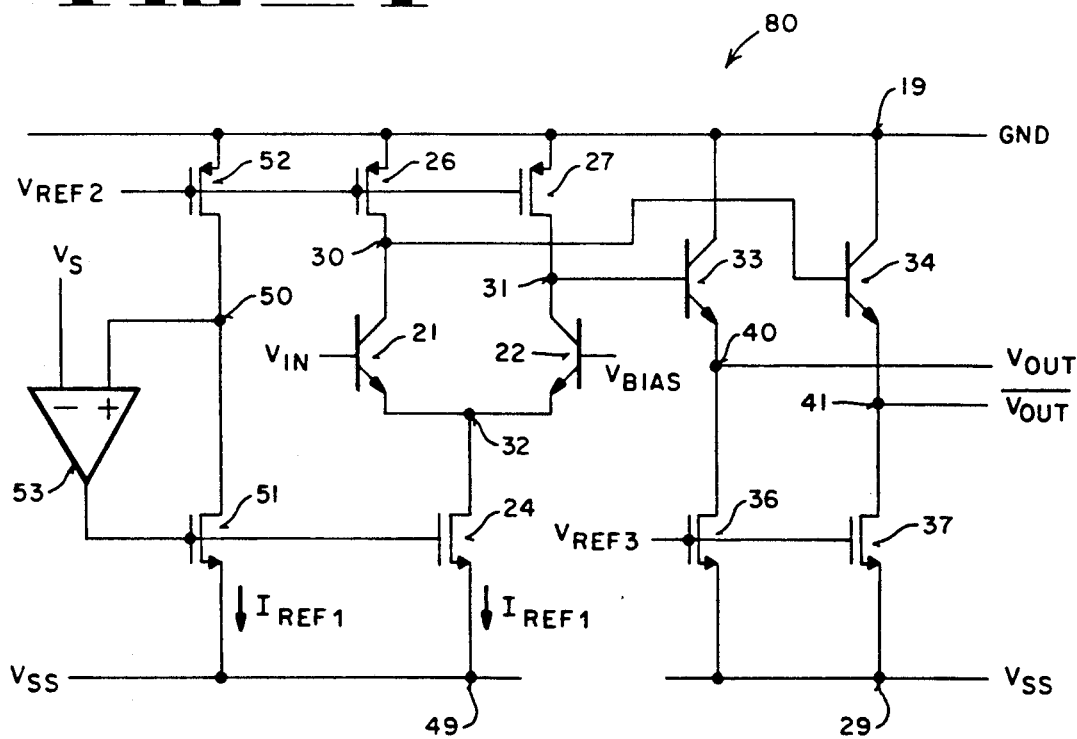
FIG_4

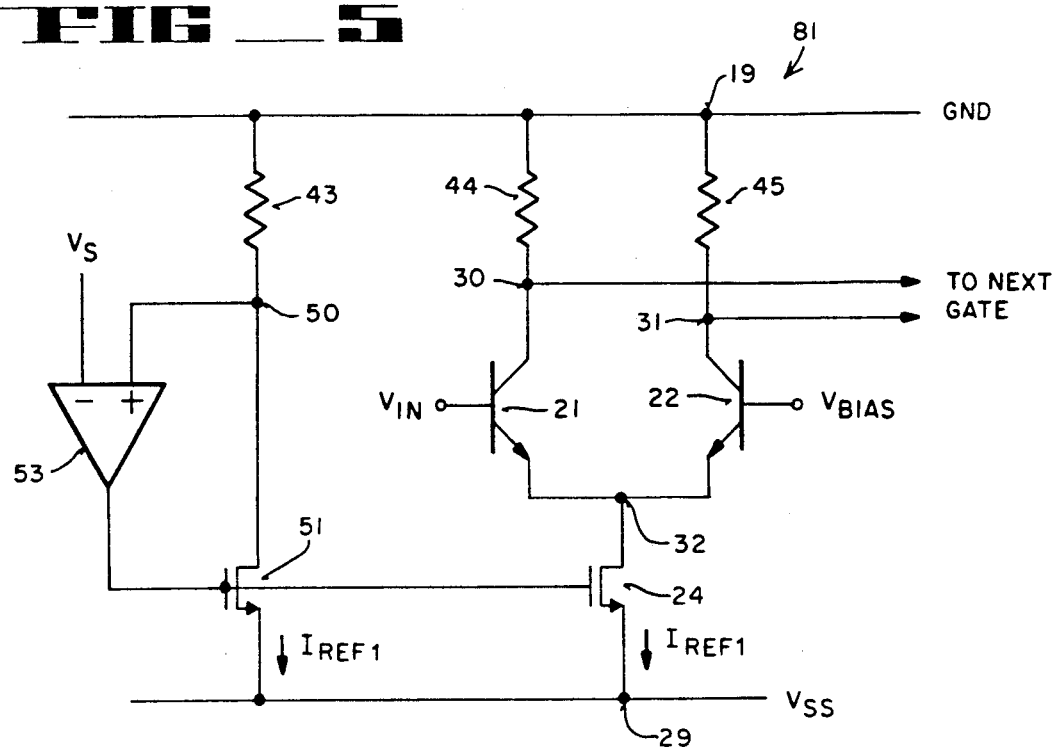
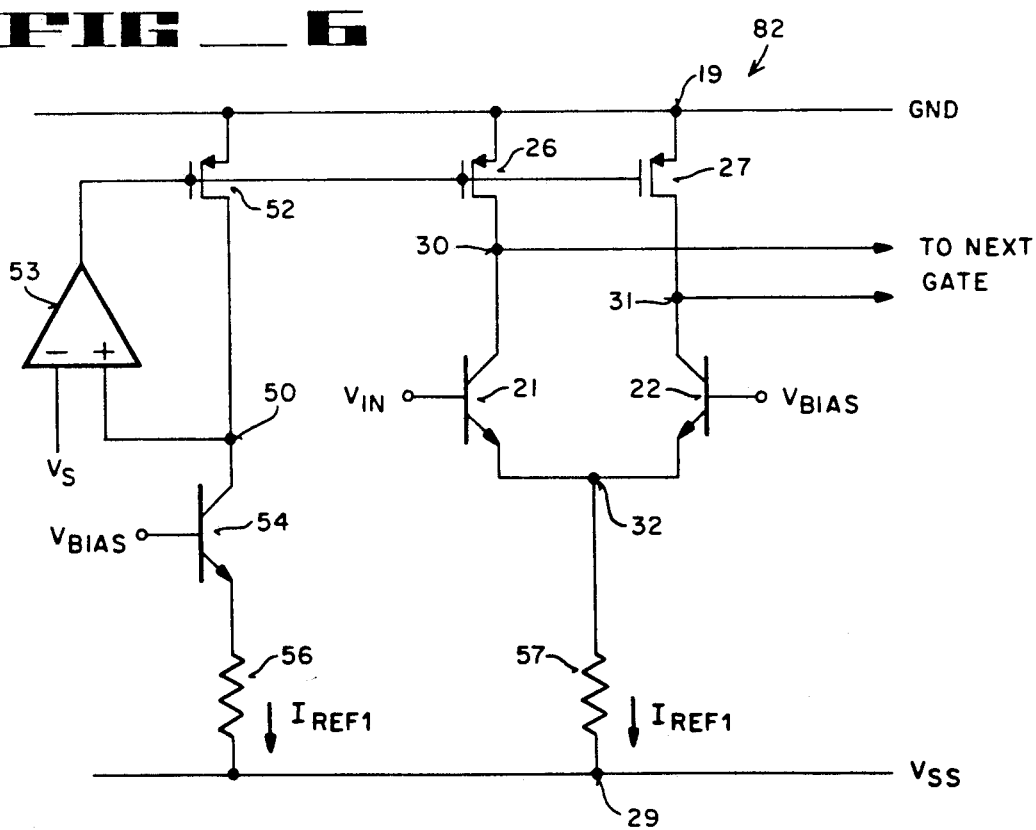

BICMOS LOGIC GATE HAVING LINEARLY OPERATED LOAD FETS

FIELD OF THE INVENTION

The present invention generally relates to the field of integrated circuits which combine bipolar and complimentary metal-oxide semiconductor (CMOS) devices on the same substrate. More particularly, the invention relates to emitter-coupled-logic (ECL) logic gates implemented using a BiCMOS process technology.

BACKGROUND OF THE INVENTION

Recently, researchers have been directing their attention toward developing digital logic circuits which combine bipolar and CMOS technologies in a single integrated circuit. The marriage of bipolar and CMOS technologies is particularly advantageous since the superior aspects of each may be exploited and combined to yield optimal circuit performance.

For instance, CMOS circuits have the advantages of extremely low quiescent power consumption, rail-to-rail output capability, high density and a very high input impedance. Bipolar logic circuits, on the other hand, are useful in driving large capacitance loads, have very fast switching capabilities and feature better performance over temperature and power supply. These attributes have lead to the development of a family of BiCMOS digital logic circuits which employ bipolar transistors to drive output loads while utilizing CMOS devices to perform the basic logic functions on the received input signals. Digital logic circuits implemented using BiCMOS technology are discussed in "BiCMOS Technology and Applications", edited by Antonio R. Alvarez, Kluwer Academic Publishers, 1990, Chapter 5 (pages 165-200). Examples of BiCMOS binary logic circuits are also disclosed in U.S. Pat. Nos. 4,701,642; 4,871,928; 4,845,385; 4,703,203; 4,636,665; 4,779,014; and 4,808,850.

Emitter-coupled logic (ECL) is a very well understood family of bipolar logic circuitry. Its popularity stems from the fact that ECL provides the faster bipolar logic available. However, the main drawback is the fact that bipolar ECL gates also consume the most power of conventional logic technologies. Thus, it would be desirable to integrate the high switching speed capabilities of conventional bipolar ECL along with the high-density, low-power characteristics of CMOS circuits. A hybrid ECL/MOS family of logic circuits would be capable of taking advantage of the strengths of the individual technologies.

Unfortunately, past attempts to create BiCMOS ECL logic gates have not been entirely successful. BiCMOS logic gates often have difficulty matching the temperature and supply dependence of ECL circuitry. The complicated temperature dependence of the bipolar transistor counts in large part for this difficulty to interface ECL circuitry with CMOS logic stages. While the problem of the bipolar transistor's negative temperature coefficient has been circumvented in fully bipolar ECL logic devices (e.g., the Motorola 100K ECL family), merged ECL/MOS circuits have not been as successful.

Therefore, what is needed is an integrated circuit (IC) combining CMOS and bipolar technologies which implements an ECL compatible logic function. Such as circuit should be capable of compensating for the negative effects of process and temperature variations which are an ordinary part of an IC's operating environment.

As will be seen, the present invention provides a novel BiCMOS ECL gate possessing these characteristics. In addition, the invented ECL logic gate features the ability to vary the output voltage swing as well as control the total power dissipation of the circuit.

SUMMARY OF THE INVENTION

The BiCMOS logic circuit of the present invention includes an emitter-coupled pair of bipolar transistors for differentially comparing an input signal with a first reference potential. The first reference potential is normally set to be at about the midpoint between the logic levels of the input signal. In one embodiment, each of the bipolar transistors are loaded by a p-channel metal-oxide-semiconductor (PMOS) transistor. The PMOS devices are coupled between the collectors of the respective bipolar transistors and a first supply potential (e.g ground).

In the embodiment described, an emitter follower is employed to provide the output signal. The emitter follower has its base coupled to the collector of one of the bipolar transistors, and its collector connected to the first power supply potential. The output signal appears at the emitter, which is also coupled to a second biasing means. A first biasing means is utilized for biasing the emitter-coupled pair. Preferably, ordinary NMOS transistors having their gates coupled to a reference potential are used as current sources for biasing the emitter-coupled pair and the emitter follower.

A circuit means is included to provide a feedback signal coupled to the gates of the PMOS transistors for dynamically controlling the load resistance presented to said emitter coupled pair. This feedback signal essentially controls the voltage swing of the output signal, thereby maintaining the compatibility of the logic levels of the circuit over temperature, supply and process variations. The invented logic circuit is capable of being expanded to produce an entirely new family of BiCMOS logic gates.

BRIEF DESCRIPTION OF THE DRAWINGS

The present invention is illustrated by way of example and not limitation in the figures of the accompanying drawings, in which like references indicates similar elements, and wherein;

FIG. 1 is a circuit schematic of a basic prior art bipolar ECL logic gate.

FIG. 2 is a circuit schematic of one embodiment of the BiCMOS logic gate of the present invention.

FIG. 3 is a circuit schematic of an alternative embodiment of the present invention which utilizes feedback.

FIG. 4 is yet another alternative embodiment of the logic gate of the present invention.

FIG. 5 is another embodiment of the present invention.

FIG. 6 is still another alternative embodiment of the logic gate of the present invention.

DETAILED DESCRIPTION

In the following description, a novel BiCMOS logic gate is disclosed in which numerous specific details are set forth, such as specific conductivity types, circuit configurations, voltages, etc., in order to provide a thorough understanding of the present invention. It will be obvious, however, to one skilled in the art that these specific details need not be used to practice the present invention. In other instances, well known structures and circuits have not been shown in detail in order to avoid unnecessarily obscuring the present invention.

DISCUSSION OF THE PRIOR ART

Referring to FIG. 1, there is illustrated a conventional prior art emitter-coupled logic (ECL) gate 10. Gate 10 includes emitter-coupled bipolar transistors 11 and 12 for comparing an input signal $V_{IN}$ with a reference potential $V_{BIAS}$. Reference potential $V_{REF1}$ generates a reference current $I_{REF1}$ which flows either through transistor 11 or transistor 12, depending on the applied input. By way of example, if the voltage $V_{IN}$ exceeds $V_{BIAS}$, then the current $I_{REF1}$ will be steered through transistor 11 and resistor 16. This current flow causes a corresponding voltage drop across resistor 16. At the same time, because no current flows through transistor 12 or resistor 17, the collector node of transistor 12 remains at approximately ground potential.

Of course, any voltage drop appearing across resistor 16 or 17 also appears at the bases of the respective output emitter follower transistors. The output signal $V_{\overline{OUT}}$ and its compliment $V_{OUT}$, are provided at output nodes 14 and 15, respectively. Note that the output emitter follower transistors are biased with a current $I_{REF2}$ generated by a second reference potential, $V_{REF2}$. As previously discussed, one of the main drawbacks of logic gate 10 is its high quiescent operating current. In other words, logic gate 10—although capable of switching at very high speed—suffers from a correspondingly high power dissipation.

DISCUSSION OF THE PRESENT INVENTION

FIG. 2 illustrates a circuit schematic of a BiCMOS logic gate 20, which is represents one embodiment of the present invention. Gate 20 utilizes an emitter-coupled pair of bipolar transistors 21 and 22 for comparing an input signal $V_{IN}$ with a reference potential $V_{BIAS}$. One of the key differences between logic gate 20 of FIG. 2 and the prior art gate of FIG. 1 is that gate 20 is implemented using ordinary BiCMOS technology. Specifically, n-channel metal-oxide-semiconductor (NMOS) transistors 24, 36 and 37 are employed as current sources in gate 20, and p-channel metal-oxide-semiconductor (PMOS) transistors 26 and 27 are employed as load resistors. The magnitude of the current flowing through the emitter-coupled pair is set by the reference voltage, $V_{REF1}$, coupled to the gate of NMOS transistor 24. FIG. 2 shows the source and drain of NMOS transistor 24 being coupled between nodes 29 (e.g., $V_{SS}$) and 32, respectively.

The reference potential $V_{REF3}$, coupled to the gates of transistors 36 and 37, is used to establish the reference current which flows through output emitter follower transistors 33 and 34. In this respect, transistors 36 and 37 function as current sources. As can be seen, the drain of NMOS transistor 36 is coupled to output node 40 (i.e., $V_{OUT}$), while the drain of NMOS transistor 37 is coupled to output node 41 (i.e., $V_{\overline{OUT}}$). Transistors 36 and 37 both have their sources coupled to the lowest operating supply potential (e.g., $V_{SS}$) at node 29.

NMOS transistors 24, 36 and 37 are preferably operated in the saturation region. An advantage of utilizing n-channel field effect devices as current sources in the circuit of FIG. 2 is that the temperature coefficient of the saturation current for these devices is nearly zero. That is, the reference current produced by voltages $V_{REF1}$ and $V_{REF3}$ remains virtually constant over temperature. (Note that circuit 20 may also be configured such that the gates of transistors 24, 36 and 37 are all coupled to a single reference potential.)

PMOS transistors 26 and 27, on the other hand, operate in the linear region as load devices for the emitter coupled pair 21 and 22. The value of the load resistance for each of the PMOS transistors is determined by the reference voltage $V_{REF2}$ (obviously, the size of the PMOS transistors must also be taken into consideration). Observe that voltage $V_{REF2}$ is coupled to the gates of PMOS transistors 26 and 27. Also note that FIG. 2 shows transistors 26 having its source and drain coupled across nodes 19 and 30, while transistor 27 has its source and drain coupled between nodes 19 and 31, respectively.

Utilizing PMOS field-effect devices as load resistors in the circuit of FIG. 2 provides a distinct advantage over prior art designs. By way of example, it is often difficult to fabricate resistors which match in value across the integrated circuit. In contrast, PMOS transistors are relatively easy to match. PMOS transistors also track each other extremely well over voltage and temperature variations. Moreover, the resistance of the PMOS devices—when operated in the linear range—can be easily adjusted by changing the potential applied to the gate. In this manner, the resistance of load transistors 26 and 27 can be controlled by means of reference potential $V_{REF2}$. The significance of this is that the effect of variations such as temperature and power supply on the gate output voltage can be offset by proper control of the potential $V_{REF2}$ in accordance with the present invention.

BiCMOS circuit 20 also includes emitter follower transistors 33 and 34, providing outputs $V_{\overline{OUT}}$ and $V_{OUT}$ at nodes 40 and 41, respectively. Transistor 33 has its collector coupled to the positive-most supply node 19 (e.g., ground) and its base coupled to node 31, while transistor 34 has its collector coupled to node 19 and its base to node 30. Both of transistors 33 and 34 are biased by current source NMOS transistors 36 and 37, as discussed previously.

It should understood that the invented logic gate of FIG. 2 is represented in a simplified form for ease of understanding. It would be obvious to extend the basic circuit diagram of FIG. 2 in order to implement other well known logic gates functions (e.g., OR, NOR, XOR, multi-level logic, latches, etc.). Furthermore, transistors 33, 34, 36 and 37 may be eliminated to transform circuit 20 from an ECL-type logic gate to a CML-type gate. When configured as a CML gate, the outputs $V_{OUT}$ and $V_{\overline{OUT}}$ are provided as nodes 31 and 30, respectively, which are then directly coupled to the input nodes of the next gate. Each of these variations and extensions of the circuit of FIG. 2 are considered to be well within the spirit and scope of the present invention.

One means of establishing the reference voltage for the gates of the PMOS load transistors is illustrated in the circuit 70 of FIG. 3. The feedback configuration of the embodiment of FIG. 3 is remarkable in that it cancels the effects of temperature, supply voltage and process variations.

BiCMOS logic gate 70 operates in the same manner as gate 20, except that the reference voltage provided to the gate of transistors 26 and 27 is now generated by operational amplifier 53. Amplifier 53 preferably comprises any one of a number of well known CMOS, bipolar or BiCMOS differential amplifiers. In addition to driving devices 26 and 27, amplifier 53 also drives the gate of PMOS transistor 52. Transistor 52 has its source coupled to node 19 and its drain connected to node 50. Node 50 provides the positive input to amplifier 53. The negative input of amplifier 53 is coupled to a reference voltage $V_S$.

The feedback configuration of FIG. 3 also includes an additional NMOS transistor 51. Transistor 51 is shown having its source coupled to $V_{SS}$ node 49 and its drain coupled to node 50. The gate of NMOS transistor 51 is coupled to reference potential $V_{REF1}$. Recall that reference potential $V_{REF1}$ is also used to establish the reference current, $I_{REF1}$, for the input logic switching stage of gate 70. The primary external references in logic circuit 70 are $V_{REF1}$ and $V_{REF2}$ which control the respective currents in the emitter-coupled input transistors 21 and 22, and the output emitter follower transistors 33 and 34. (Reference voltage $V_{BIAS}$ is again coupled to the base of bipolar transistor 22.)

It is appreciated that in most implementations the operating potential provided at node 49 is ordinarily the same as that provided at node 29 (e.g., $V_{SS}$). This means that nodes 49 and 29 are usually tied together. However, certain applications may derive some advantage from having separate supply potentials associated with the input and output stages of logic gate 70.

Preferably, NMOS transistor 51 is matched to NMOS transistor 24 so that the same current (i.e., $I_{REF1}$) flowing through PMOS transistor 52 flows through either of PMOS transistors 26 or 27, depending of the value of the input $V_{IN}$. The matching of currents through these devices can be further improved by connecting a bipolar transistor in series between node 50 and the drain of device 51. The gate of this additional bipolar transistor should be coupled to $V_{BIAS}$ in order to insure that the drains of transistors 51 and 24 are at identical potentials.

The idea is to make the voltage at node 50 virtually identical to the voltage at either of nodes 30 or 31 (again depending on which transistors 21 or 22 the current $I_{REF1}$ is flowing). This means that PMOS transistor 52 is preferably matched to transistors 26 and 27. When configured in this manner, amplifier 53 automatically adjusts the gate voltage of transistors 52, 26 and 27 in response to the voltage appearing at node 50, such that the drain voltage of these transistors is forced to be equal to $V_S$.

Suppose that the drain voltage of reference PMOS transistor 52 drops to a lower value because of some variation in power supply voltage, temperature, etc. Any change in the potential at node 50 causes a corresponding change in the differential voltage presented to operational amplifier 53. In response, amplifier 53 drives its output to a lower voltage which, in turn, reduces the "on" load resistance of PMOS transistor 52 (and also transistors 26 and 27). The lower gate potential applied to transistor 52 causes the drain voltage of transistor 52 (i.e., node 50) to move to a higher value. It does this until the feedback loop is again balanced. Hence, the feedback configuration of logic gate 70 compensates for the negative effects of process, temperature and power supply variations.

It is, of course, crucial that the same gate voltage applied to PMOS transistor 52 is also appled to the gates of load transistors 26 and 27. Coupling the output of amplifier 53 to the gate of all three PMOS transistors, and providing a feedback voltage from node 50, permits the ECL gate of FIG. 3 to maintain a constant output voltage swing independent of any external variations. The value of swing appearing across nodes 30 and 31 (or nodes 40 and 41) is equal to the reference potential $V_S$. It should be apparent that due to the feedback configuration of gate 70, that the voltage swing at the output of the ECL gate is easily controlled by adjustment of the reference potential $V_S$. That is, the output logic swing levels can be changed in real-time by appropriate control $V_S$. In conventional logic circuits, the output swing is set during the fabrication of the device and cannot be changed thereafter. However, in the case of the circuit of FIG. 3, it is possible to change the output swing during operation of the device. This feature is a great benefit for circuits which may require more or less switching sensitivity, or when driving non-ECL compatible circuitry.

An additional feature of the present invention is the fact that the power consumption of BiCMOS logic gate 70 is easily controlled by adjustment of the reference potential $V_{REF1}$. As $V_{REF1}$ is increased, the switching speed of the circuit increases accordingly. At the same time, the feedback nature of the circuit keeps the output voltage swing constant (as set by $V_S$). Note that the voltage swing $V_S$ is independent of the current dissipated in logic gate 70. Thus, power dissipation and switching speed are factors which may be controlled and/or continuously varied in accordance with the present invention. This permits a wide range of applications beyond that of ordinary prior art logic gates.

The present invention also overcomes the prior art problem of proper control of $V_{OL}$ (output low voltage). In prior art circuits, $V_{OL}$ is commonly adversely affected by local noise on the ground or $V_{SS}$ supply lines. On the other hand, logic gate 70 has a low output voltage level which is independent of changes in ground or supply—$V_{OL}$ being completely determined by $V_S$.

FIG. 4 illustrates an alternative embodiment of the present invention in which feedback amplifier 53 drives the gates of NMOS transistors 51 and 24, rather than transistors 52, 26 and 27. Once again, the positive input of amplifier 53 is coupled to node 50 while the negative input is connected to reference voltage $V_S$. The gates of PMOS transistors 52, 26 and 27 are shown being coupled to external reference potential $V_{REF2}$.

In the embodiment of FIG. 4, the gate voltage of the PMOS load transistors is driven externally while the gate voltage of current source NMOS transistors 51 and 24 is automatically adjusted by feedback amplifier 53 to maintain the voltage swing of the ECL gate. As before, the output voltage swing at either of nodes 30 and 30 (or 40 and 41) is equal to $V_S$. In all other respects, the embodiment of FIG. 4 operates analogously to that described previously in connection with FIGS. 2 and 3.

Instead of compensating the load resistance values of PMOS transistors 26 and 27 to maintain the output voltage swing independent of external variations, the circuit of FIG. 4 achieves the same end by changing the bias voltage applied to transistors 51 and 24. Transistors 51 and 24, of course, establish the current flow through devices 52 and 26 or 27. Thus, while gate 70 focused on the resistance provided by transistors 26 and 27, the circuit of FIG. 4 concentrates on adjusting the current $I_{REF1}$, by alternating the bias potential supplied to the current sources comprising transistors 51 and 24. Both embodiments rely upon feedback to cancel the effects of temperature, power supply, and process variations.

Logic gate 81 of FIG. 5 illustrates how the feedback concept explained above can be utilized in a integrated circuit which uses ordinary resistors in place of PMOS load transistors. In circuit 81, matched resistors 43, 44 and 45 replace respective transistors 52, 26 and 27 from the corresponding circuit of FIG. 4. FIG. 5 also illustrates CML operating principles, wherein the emitter follower output transistors are omitted and the output of gate 81 is provided at nodes 30 and 31. These nodes can then be coupled directly to an input of another gate consistent with the CML logic family.

Still another embodiment of the present invention is shown in FIG. 6. Logic gate 82 of FIG. 6 operates analogously to gate 70 of FIG. 3, except that transistors 51 and 24 are shown being replaced by matched resistors 56 and 57. Also, bipolar transistor 54 is included in series between node 50 and resistor 56 for the purpose of insuring that identical currents $I_{REF1}$ flow through the switching and reference stages of gate 82 (see earlier discussion with resepct to FIG. 3). The base of transistor 54 is coupled to reference potential $V_{BIAS}$. BiCMOS logic gate 82 is also configured as a CML gate.

Although the present invention has been described in conjunction with certain embodiments, it is appreciated that the invention may be implemented in a variety of other ways. By way of example, other circuit means for implementing feedback to control the resistance of the load PMOS transistors are possible. Consequently, it is to be understood that the particular embodiments shown and described by way of illustration are no way intended to be considered limiting. Reference to the details of these embodiments is not intended to limit the scope of the claims which themselves recite only those features regarded as essential to the invention.

We claim:

1. A BiCMOS logic circuit which comprises:
   an emitter-coupled pair of bipolar transistors for differentially comparing an input signal with a first reference potential,
   each of said bipolar transistors being loaded by a linearly operated field-effect transistor coupled between its collector and a first operating potential, the gates of said field-effect transistors being coupled to a second reference potential for controlling the load resistance presented to said emitter-coupled pair by said field-effect transistor; and
   a first biasing means for biasing said emitter-coupled pair.

2. The circuit of claim 1 wherein said field-effect transistors each comprise a p-channel metal-oxide-semiconductor (PMOS) transistor.

3. The circuit of claim 2 further comprising an emitter follower transistor having its base coupled to the collector of one of said bipolar transistors to provide an ECL-compatible output logic signal; and
   second biasing means for biasing said emitter follower transistor.

4. The circuit of claim 3 wherein said first biasing means comprises a first n-channel metal-oxide-semiconductor (NMOS) transistor coupled between said emitter-coupled pair and a second operating potential, said first NMOS transistor having its gate coupled to a third reference potential.

5. The circuit of claim 4 wherein said first NMOS transistor is operated in the satuation region.

6. The circuit of claim 4 wherein said second biasing means comprises a second NMOS transistor coupled between the emitter of said emitter follower transistor and said second operating potential, said second NMOS transistor having its gate coupled to a fourth reference potential.

7. The circuit of claim 6 wherein said third and fourth reference potentials are equal.

8. A BiCMOS logic circuit comprising;
   an emitter-coupled pair of bipolar transistors for differentially comparing an input signal with a first reference potential,
   each of said bipolar transistors being loaded by a linearly operated p-channel metal-oxide-semiconductor (PMOS) transistor coupled between its collector and a first operating potential;
   a first biasing means for biasing said emitter-coupled pair; and
   a circuit means providing a control signal coupled to the gates of said PMOS transistors for controlling the load resistance presented to said emitter-coupled pair by said PMOS transistors.

9. The logic circuit of claim 8 wherein said circuit means is coupled to a second reference potential which determines the output swing of said logic circuit.

10. The logic circuit of claim 9 further comprising:
    an emitter follower transistor having its base coupled to the collector of one of said bipolar transistors to provide an ECL-compatible output logic swing; and
    a second biasing means for biasing said emitter follower transistor.

11. The logic of claim 10 wherein said control signal maintains the ECL compatibility of said output swing over temperature, supply and process variations.

12. The logic circuit of claim 9 or 11 wherein said PMOS transistors are matched.

13. The logic circuit of claim 9 wherein said first biasing means comprises a first n-channel metal-oxide-semiconductor (NMOS) transistor coupled between said emitter-coupled pair and a second operating potential, said first NMOS transistor having its gate coupled to a third reference potential.

14. The logic of claim 11 wherein said first biasing means comprises a first n-channel metal-oxide-semiconductor (NMOS) transistor coupled between said emitter-coupled pair and a second operating potential, said first NMOS transistor having its gate coupled to a third reference potential, and said second biasing means comprises a second NMOS transistor coupled between the emitter of said emitter follower and a third operating potential, said second NMOS transistor having its gate coupled to a fourth reference potential.

15. The logic circuit of claim 13 or 14 wherein said circuit means comprises a reference PMOS transistor and a third biasing means for biasing said reference PMOS transistor, said reference PMOS transistor being coupled to receive said control signal.

16. The logic circuit of claim 15 wherein said circuit means further includes an amplifier means for generating said control signal from a comparison of the drain potential of said reference PMOS transistor and said second reference potential, said amplifier means adjusting said control signal so that said drain potential is approximately equal to said second reference potential.

17. The logic circuit of claim 16 wherein said third biasing means comprises a reference NMOS transistor having its gate coupled to said third reference potential, said reference PMOS and NMOS transistors being coupled in series between said first and second operating potentials.

18. The logic circuit of claim 17 wherein said amplifier means comprises an operational amplifier.

19. The logic circuit of claim 17 wherein said reference PMOS transistor is matched to said PMOS load transistors, and said reference NMOS transistors is matched to said first NMOS transistor.

20. The logic circuit of claim 19 wherein said third and fourth supply potentials are equal.

21. A BiCMOS logic circuit comprising;
an emitter-coupled pair of bipolar transistors for differentially comparing an input signal with a first reference potential;
a means for loading each of said bipolar transistors, said means for loading comprising a pair of linearly operated p-channel metal-oxide-semiconductor transistors, each of said PMOS transistors being coupled between the collector of a corresponding bipolar transistor of said emitter-coupled pair and a first operating potential;
a first biasing means for biasing said emitter-coupled pair; and
a circuit means providing a control signal to said loading measn for controlling the load resistance presented to said emitter-coupled pair by said loading means.

22. The logic circuit of claim 21 wherein said circuit means is coupled to a second reference potential which determines the output swing of said logic circuit.

23. The logic circuit of claim 22 further comprising:
an emitter follower transistor having its base coupled to the collector of one of said bipolar to provide an ECL-compatible output logic swing; and
a second biasing means for biasing said emitter follower transistor.

24. The logic circuit of claim 23 wherein said control signal maintains the ECL compatibility of said output swing over temperature, supply and process variations.

25. The logic circuit of claim 21 wherein said PMOS transistors are matched.

26. The logic circuit of claim 22 wherein said first biasing means comprises a first n-channel metal-oxide-semiconductor (NMOS) transistor coupled between said emitter-coupled pair and a second operating potential, said first NMOS transistor having its gate coupled to a third reference potential.

27. The logic circuit of claim 23 wherein said first biasing means comprises a first n-channel metal-oxide-semiconductor (NMOS) transistor coupled between said emitter-coupled pair and a second operating potential, said first NMOS transistor having its gate coupled to a third reference potential, and said second biasing means comprises a second NMOS transistor coupled between the emitter of said emitter follower and a third operating potential, said second NMOS transistor having its gate coupled to a fourth reference potential.

28. The logic circuit of claim 26 or 27 wherein said circuit means comprises a reference PMOS transistor and a third biasing means for biasing said reference PMOS transistor, said reference PMOS transistor being coupled to receive said feedback signal.

29. The logic circuit of claim 28 wherein said circuit means further includes an amplifier means for generating said feedback signal from a comparison of the drain potential of said reference PMOS transistor and said second reference potential, said amplifier means adjusting said control signal so that said drain potential is approximatly equal to said second reference potential.

30. The logic circuit of claim 29 wherein said third biasing means comprises a reference NMOS transistor having its gate coupled to said third reference potential, said reference PMOS and NMOS transistors being coupled in series between said first and second operating potentials.

31. The logic circuit of claim 29 wherein said amplifier means comprises an operational amplifier.

32. The logic circuit of claim 28 wherein said reference PMOS transistor is matched to said PMOS load transistors, and said reference NMOS transistor is matched to said first NMOS transistor.

33. The logic circuit of claim 27 wherein said second and third operating potentials are equal.

* * * * *